(12) United States Patent
Shin

(10) Patent No.: US 7,026,250 B2
(45) Date of Patent: Apr. 11, 2006

(54) METHOD FOR REDUCING CONTACT RESISTANCE OF A SEMICONDUCTOR DEVICE

(75) Inventor: Dong Suk Shin, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 195 days.

(21) Appl. No.: 10/679,377

(22) Filed: Oct. 7, 2003

(65) Prior Publication Data

US 2004/0072431 A1    Apr. 15, 2004

(30) Foreign Application Priority Data

Oct. 8, 2002    (KR) .................. 10-2002-0061248

(51) Int. Cl.
*H01L 21/302* (2006.01)
(52) U.S. Cl. .................. 438/706; 438/724; 438/745
(58) Field of Classification Search ........... 438/706, 438/710, 712, 723, 724, 745, 756
See application file for complete search history.

(56) References Cited

U.S. PATENT DOCUMENTS

| | | | | |
|---|---|---|---|---|
| 5,689,126 A | * | 11/1997 | Takaishi | 257/306 |
| 6,150,247 A | * | 11/2000 | Liaw et al. | 438/592 |
| 6,369,008 B1 | * | 4/2002 | Ha et al. | 510/175 |
| 6,369,446 B1 | * | 4/2002 | Tanaka | 257/758 |
| 6,372,657 B1 | * | 4/2002 | Hineman et al. | 438/723 |
| 6,436,808 B1 | * | 8/2002 | Ngo et al. | 438/623 |
| 6,562,651 B1 | * | 5/2003 | Chung et al. | 438/98 |
| 6,638,855 B1 | * | 10/2003 | Chang et al. | 438/637 |
| 6,838,330 B1 | * | 1/2005 | Moon et al. | 438/230 |

FOREIGN PATENT DOCUMENTS

| | | |
|---|---|---|
| JP | 02-153525 | 6/1990 |
| KR | 99-0006146 | 1/1999 |

\* cited by examiner

*Primary Examiner*—Kin-Chan Chen
(74) *Attorney, Agent, or Firm*—Heller Ehrman LLP

(57) ABSTRACT

A method for fabricating a semiconductor device wherein the lower portion of a contact hole is cleaned, and doped with an impurity for reducing contact resistance is disclosed. The method comprises: sequentially forming a buffer layer and an interlayer insulating film on a semiconductor substrate; etching the interlayer insulating film and the buffer layer to form a contact hole exposing the semiconductor substrate; performing a cleaning process of a lower portion of the contact hole; doping an impurity into the surface of the semiconductor substrate exposed by the contact hole; and forming a conductive layer filling the contact hole on the entire surface of the resulting structure.

16 Claims, 3 Drawing Sheets

METHOD FOR REDUCING CONTACT RESISTANCE OF A SEMICONDUCTOR DEVICE

BACKGROUND OF THE INVENTION

1. Field of the Invention

The present invention relates to a method for fabricating a semiconductor device, and more particularly to a method for fabricating a semiconductor device wherein the lower portion of a contact hole is cleaned, and doped with an impurity for improving the refresh characteristics and reducing the contact resistance to improve operation capability of the device.

2. Description of the Background Art

As the integration density of semiconductor device is increased, the line width of the device has decreased. A various processes have been developed and used to fabricate devices with excellent characteristics.

In particular, a contact formation process for reducing contact resistances has been newly suggested to improve operation efficiency of a device.

In a conventional semiconductor device, a silicon contact material consists of polysilicon containing impurities. In case of an ideal contact interface, a contact resistance due to difference of work function does not exist between the polysilicon and the semiconductor substrate. That is, the contact resistance between the silicons is extremely low when they have nearly equal impurity concentrations. However, the contact resistance between the polysilicon and the semiconductor substrate generally is relatively high in real cases. The contact resistance of n-type contact cell having a contact area of 0.10 $\mu m^2$ is about 10 k$\Omega$. Such a high contact resistance is due to a native oxide film and carbon containing residues at the interface between the polysilicon and the semiconductor substrate.

Generally, even though a polysilicon layer is deposited after a wet cleaning process without any delays in a conventional contact formation process, the contact resistance cannot be effectively reduced.

A conventional method for fabricating a semiconductor device will now be described.

A device isolation film defining an active region is formed on a semiconductor substrate.

A buffer layer having a predetermined thickness is formed on the entire surface of the resulting structure. Preferably, the buffer layer consists of a nitride film, and serves as an etch barrier in a subsequent etching process for forming a contact hole to prevent damages of the active region.

An interlayer insulating film is formed on the buffer layer. Preferably, the interlayer insulating film is an oxide film, and has an etching selectivity over the buffer layer.

The interlayer insulating film and the buffer layer is etched using a contact mask exposing a predetermined contact area to form a contact hole. In the etching process, the interlayer insulating film is removed using the buffer layer as an etch barrier, and the buffer layer is then removed to prevent damage of the semiconductor substrate.

The lower portion of the contact hole is cleaned. The cleaning process of the lower portion of the contact hole comprises a dry cleaning process for removing portions damaged in the contact hole etching process, and a wet cleaning process for removing carbon composite residues and a native oxide film.

Thereafter, an impurity is ion-implanted into the lower portion of the contact hole.

A contact material is formed on the entire surface of the resulting structure to fill the contact hole, and then etched back or planarized by chemical mechanical polishing process to form a contact plug.

As described above, in accordance with the conventional method for fabricating the semiconductor device, the cleaning process using a volatile organic compound solution and deionized water during the wet cleaning process after the formation of the contact hole is performed last, and thus fails to efficiently prevent the formation of a native oxide film and carbon residues on the surface of the semiconductor substrate, which increases the contact resistance.

SUMMARY OF THE INVENTION

It is an object of the present invention to provide a method for fabricating a semiconductor device wherein the lower portion of a contact hole formed by etching a buffer layer and a interlayer insulating film is cleaned, ion-implanted, and doped with an impurity to prevent the diffusion of impurities into the semiconductor substrate, thereby improving the refresh characteristics and reducing the contact resistance to improve operation capability of the device.

In order to achieve the above-described object of the invention, A method for fabricating a semiconductor device, comprising the steps of: sequentially forming a buffer layer and an interlayer insulating film on a semiconductor substrate; etching the interlayer insulating film and the buffer layer to form a contact hole exposing the semiconductor substrate; performing a cleaning process of a lower portion of the contact hole; doping an impurity into the surface of the semiconductor substrate exposed by the contact hole; and forming a conductive layer filling the contact hole on the entire surface of the resulting structure is provided.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a semiconductor device in accordance with a preferred embodiment of the present invention will now be described in detail with reference to the accompanying drawings.

Figure 1:
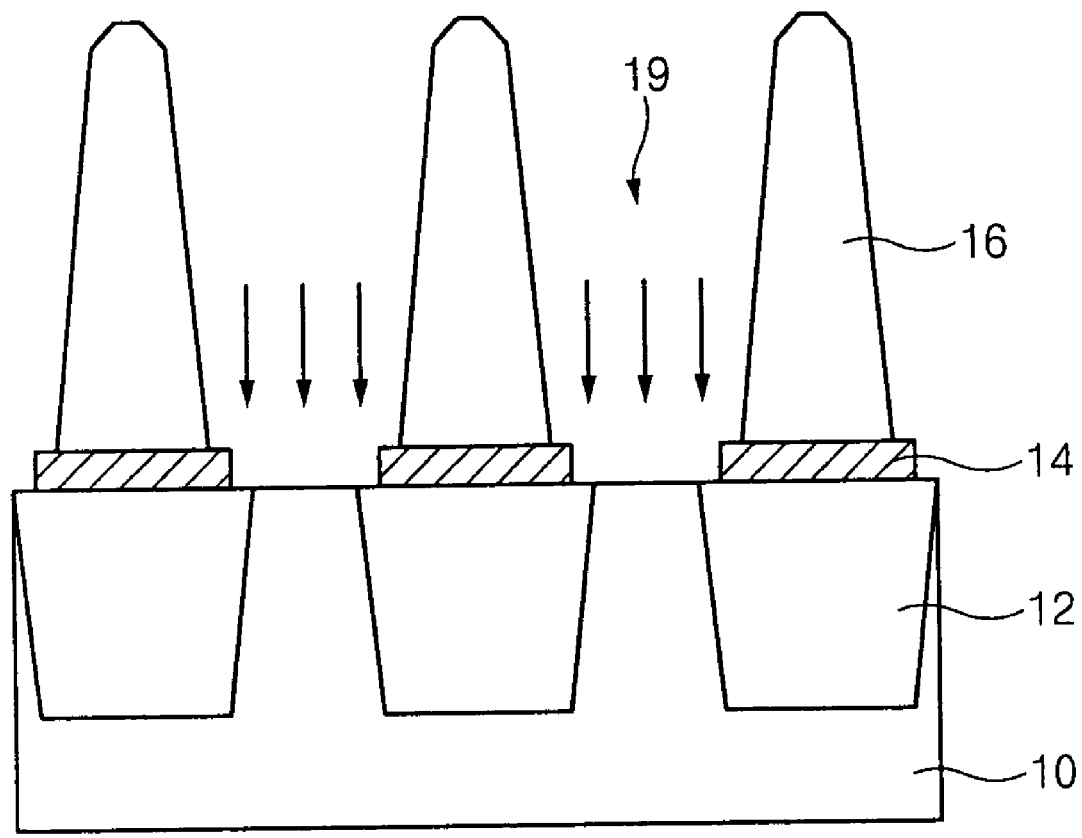
FIGS. 1 through 3 are cross-sectional diagrams illustrating sequential steps of a method for fabricating a semiconductor device in accordance with a preferred embodiment of the present invention.
Figure 2:
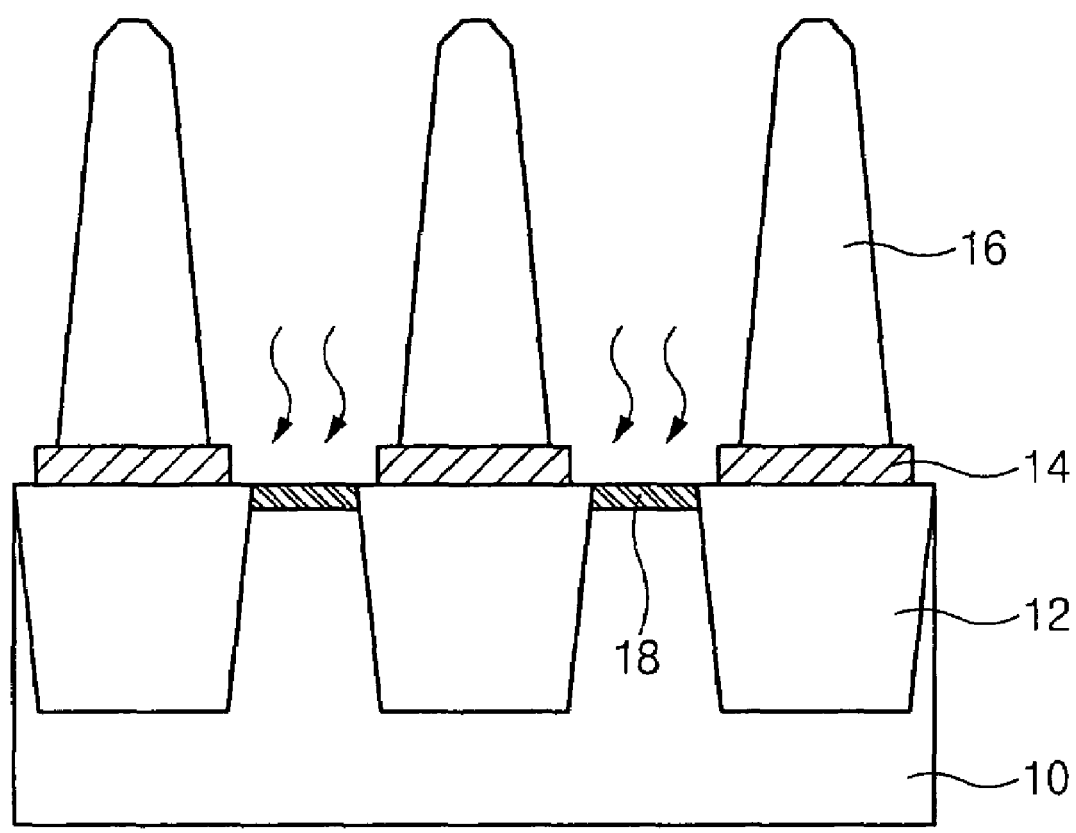
Figure 3:
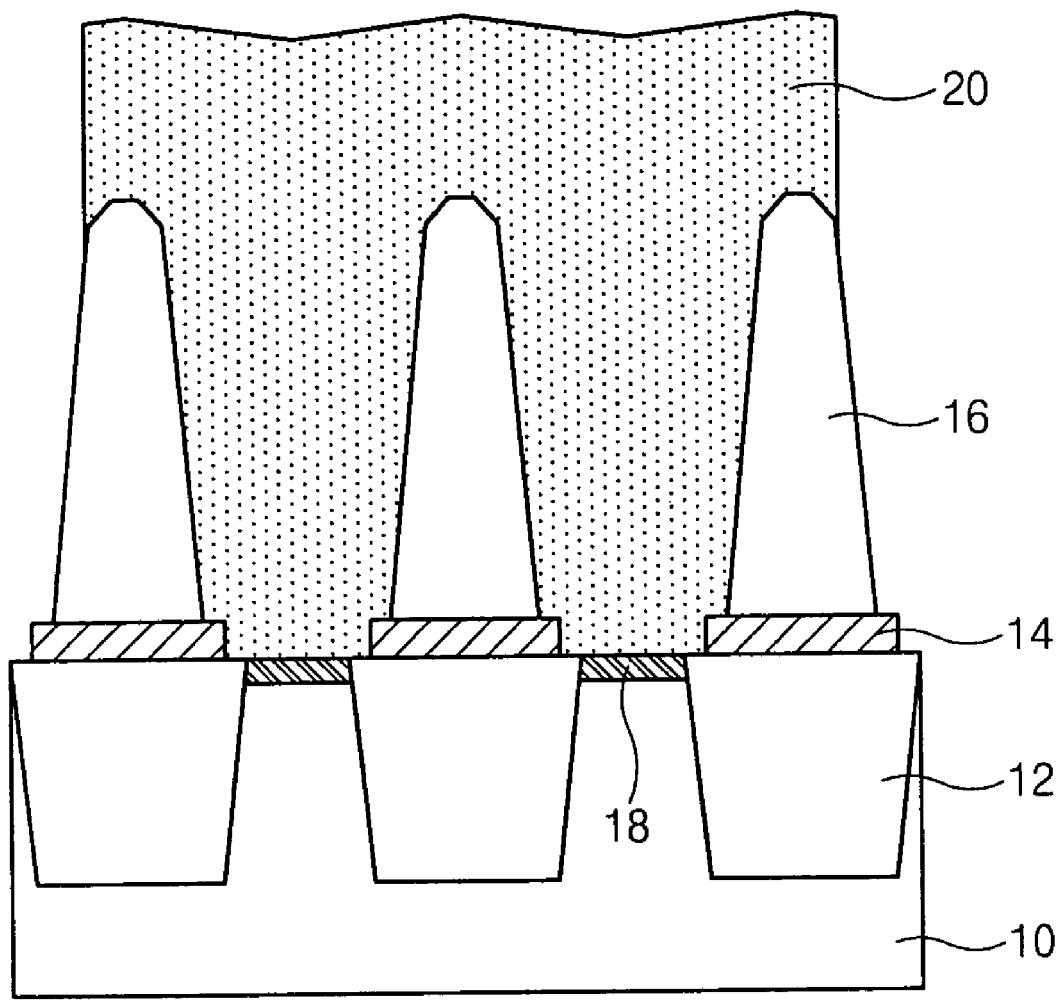

FIGS. 1 through 3 are cross-sectional diagrams illustrating sequential steps of the method for fabricating the semiconductor device in accordance with the present invention.

Referring to FIG. 1, a device isolation film 12 defining an active region is formed on a semiconductor substrate 10. The device isolation film 12 is preferably of a trench-type.

A buffer layer (not shown) having a predetermined thickness is formed on the entire surface of the resulting structure. Preferably, the buffer layer consists of a nitride film, and serves as an etch barrier in a subsequent etching process for forming a contact hole to prevent damages of the active region.

An interlayer insulating film (not shown) is formed on the buffer layer. Preferably, the interlayer insulating film is an oxide film, and has an etching selectivity over the buffer layer.

The interlayer insulating film and the buffer layer is etched using a contact mask exposing a predetermined contact area to form a contact hole 19 having a buffer layer pattern 14 and an interlayer insulating film pattern 16 on its side wall. In the etching process, the interlayer insulating film is removed using the buffer layer as an etch barrier, and the buffer layer is then removed to prevent damage of the semiconductor substrate 10.

The lower portion of the contact hole 19 is cleaned. The cleaning process of the lower portion of the contact hole 19 comprises a dry cleaning process for removing portions damaged in the contact hole etching process, and a wet cleaning process for removing carbon composite residues and a native oxide film performed in sequence.

Preferably, the dry cleaning process is performed using a plasma of mixture gas of $NH_3$, $O_2$, HE and $N_2$ for 1 to 5 minutes with a bias power ranging from 1 to 10 kW in the direction of the semiconductor substrate. In another embodiment of the present invention, the dry cleaning process is performed using a plasma of mixture gas of $NH_3$ and $N_2$, and further subjecting the resulting structure to an annealing process for 1 to 10 minutes at a temperature ranging from 100 to 500° C.

Preferably, the wet cleaning process is performed using $H_2O_2$, $H_2SO_4$, $NH_4OH$, HF, BOE solution, or combinations thereof as a cleaning solution.

An impurity is doped into the surface of the semiconductor substrate 10 exposed by the lower portion of the contact hole 19 to improve a contact resistance. In the doping process, P or As having a dose ranging from 1E10 to 1E20 atoms/$cm^2$ with an implantation energy ranging from 10 to 100 keV so that the impurity concentration is increased.

Referring to FIG. 2, the surface of the semiconductor substrate exposed by the contact hole is exposed to a $PH_3/N_2$ gas atmosphere, preferably for 5 to 60 minutes under a pressure ranging from 0.1 to 10 Torr and at a temperature ranging from 400 to 700° C., to diffuse P into the exposed the semiconductor substrate. This process is to increase the impurity concentration of the contact interface and is an optional process.

Thereafter, A conductive layer 20 for contact plug is formed on the entire surface of the resulting structure to fill the contact hole 19. The conductive layer 20 is preferably a polysilicon layer formed according to a low pressure chemical vapor deposition process using a mixture gas of mono silane (MS), $PH_3$ and $N_2$ as a reaction gas under a pressure ranging from 0.1 to 10 Torr and at a temperature ranging from 400 to 700° C. The mixture gas contains 500 to 5000 sccm of MS gas, 100 to 5000 sccm of $N_2$ gas and 10 to 1000 sccm of $H_2$ gas, and $H_2$ gas contains 1% of $PH_3$ gas.

The conductive layer 20 preferably has a thickness ranging from 1000 to 5000 Å, and 1.0E19 to 3.0E20 atoms/cc of P therein. In particular, the impurity concentration of the conductive layer 20 from the contact interface of the semiconductor substrate 10 to a depth ranging from 50 to 500 Å is 1.5E20 to 3.0E20 atoms/cc (see to FIG. 3).

As described above, in accordance with the method for fabricating the semiconductor device of the present invention, the lower portion of a contact hole formed by etching a buffer layer and a interlayer insulating film is cleaned, ion-implanted, and doped with an impurity to prevent the diffusion of impurities into the semiconductor substrate, thereby improving the refresh characteristics and reducing the contact resistance to improve operation capability of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating a semiconductor device, comprising the steps of:
    sequentially forming a buffer layer and an interlayer insulating film on a semiconductor substrate;
    etching the interlayer insulating film and the buffer layer to form a contact hole exposing the semiconductor substrate;
    performing a cleaning process of a lower portion of the contact hole;
    ion-implanting an impurity into the lower portion of the contact hole;
    doping an impurity gas into a surface of the semiconductor substrate exposed by the contact hole, wherein $PH_3/N_2$ gas is used for the impurity gas; and
    forming a conductive layer filling the contact hole on the entire surface of the resulting structure.

2. The method of claim 1, wherein the buffer layer comprises a nitride film.

3. The method of claim 1, wherein the interlayer insulating film comprises an oxide film.

4. The method of claim 1, wherein the cleaning process comprises sequentially performing a dry cleaning process for removing a portion damaged during the contact hole etching process, and a wet cleaning process for removing carbon composite residues and a native oxide film.

5. The method of claim 4, wherein the dry cleaning process is performed using a plasma of mixture gas of $NH_3$, $O_2$, He and $N_2$ for 1 to 5 minutes with a bias power ranging from 1 to 10 kW in the direction of the semiconductor substrate.

6. The method of claim 4, wherein the dry cleaning process is performed using a plasma of mixture gas of $NH_3$ and $N_2$, and the resulting structure is further subjecting to an annealing process for 1 to 10 minutes at a temperature ranging from 100 to 500° C.

7. The method of claim 4, wherein the wet cleaning process is performed using a solution selected from the group consisting of $H_2O_2$, $H_2SO_4$, $NH_4OH$, HF, BOE solutions, and combinations thereof as a cleaning solution.

8. The method of claim 1, wherein the ion-implanting process is performed by implanting P or As having a dose ranging from 1E10 to 1E20 atoms/$cm^2$ with an implantation energy ranging from 10 to 100 keV.

9. The method of claim 1, wherein the surface of the semiconductor substrate is exposed to $PH_3/N_2$ gas atmosphere for 5 to 60 minutes under a pressure ranging from 0.1 to 10 Torr and at a temperature ranging from 400 to 700° C.

10. The method of claim 1, wherein the conductive layer consists of a polysilicon layer formed in a low pressure chemical vapor deposition process using a mixture gas of mono silane (MS), $PH_3$ and $N_2$ as a reaction gas under a pressure ranging from 0.1 to 10 Torr and at a temperature ranging from 400 to 700° C.

11. The method of claim 10, wherein the flow rate of mono silane ranges from 500 to 5000 sccm.

12. The method of claim 10, wherein the flow rate of N2 ranges from 100 to 5000 sccm.

13. The method of claim 10, wherein the H2 gas contains 1% of PH3 gas and has a flow rate ranging from 10 to 1000 sccm.

14. The method of claim 1, wherein a thickness of the conductive layer ranges from 1000 to 5000 Å.

15. The method of claim 1, wherein the conductive layer consists of a polysilicon layer having 1.0E19 to 3.0E20 atoms/cc of P therein.

16. The method of claim 1, wherein the impurity concentration of the conductive layer from the contact interface to a height ranging from 50 to 500 Å ranges from 1.5E20 to 3.0E20 atoms/cc.

* * * * *